US007958477B2

(12) United States Patent
Daubenspeck et al.

(10) Patent No.: US 7,958,477 B2
(45) Date of Patent: Jun. 7, 2011

(54) STRUCTURE, FAILURE ANALYSIS TOOL AND METHOD OF DETERMINING WHITE BUMP LOCATION USING FAILURE ANALYSIS TOOL

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US); Jeffrey S. Zimmerman, Swanton, VT (US)

(73) Assignee: International Business Machines Corporation, Armonk, NY (US)

( * ) Notice: Subject to any disclaimer, the term of this patent is extended or adjusted under 35 U.S.C. 154(b) by 548 days.

(21) Appl. No.: 12/046,608

(22) Filed: Mar. 12, 2008

(65) Prior Publication Data

US 2009/0235212 A1 Sep. 17, 2009

(51) Int. Cl.
*G06F 17/50* (2006.01)
*G06F 9/455* (2006.01)
(52) U.S. Cl. ..................................................... 716/111
(58) Field of Classification Search .................. 716/2, 4, 716/10, 15–17, 110–111, 135, 137
See application file for complete search history.

(56) References Cited

U.S. PATENT DOCUMENTS

| 6,040,552 | A | 3/2000 | Jain et al. | |
| 6,513,151 | B1* | 1/2003 | Erhardt et al. | 716/21 |
| 6,609,229 | B1* | 8/2003 | Ly et al. | 716/4 |
| 7,263,677 | B1 | 8/2007 | Teig et al. | |
| 7,386,824 | B2* | 6/2008 | Porter et al. | 716/10 |
| 7,484,190 | B1* | 1/2009 | Duchesne et al. | 716/4 |
| 2003/0074173 | A1 | 4/2003 | Monroe | |
| 2005/0028123 | A1* | 2/2005 | Pekin et al. | 716/10 |
| 2005/0056913 | A1 | 3/2005 | Farnworth | |
| 2005/0105682 | A1 | 5/2005 | Heumann et al. | |
| 2005/0182584 | A1 | 8/2005 | Plusquellic | |
| 2006/0006503 | A1 | 1/2006 | Farnworth | |
| 2006/0117274 | A1* | 6/2006 | Tseng et al. | 716/1 |
| 2009/0024969 | A1* | 1/2009 | Chandra | 716/5 |

* cited by examiner

*Primary Examiner* — Stacy A Whitmore
(74) *Attorney, Agent, or Firm* — Anthony Canale; Roberts Mlotkowski Safran & Cole, P.C.

(57) ABSTRACT

A failure analysis tool, a method of using the tool and a design structure for designing a mask for protecting a critical area of wiring failure in a semiconductor chip during packaging is provided. The failure analysis tool includes a computer infrastructure operable to determine a risk area for wiring layer failure during solder bump formation by determining a distance from a center of a chip to a location for a solder bump processing and identifying an area at an edge of the location for the solder bump processes at a predetermined distance and greater from the center of the chip.

19 Claims, 8 Drawing Sheets

STRUCTURE, FAILURE ANALYSIS TOOL AND METHOD OF DETERMINING WHITE BUMP LOCATION USING FAILURE ANALYSIS TOOL

FIELD OF THE INVENTION

The present invention relates to a failure analysis tool, a method of using the tool and a design structure for designing a mask for protecting a critical area of wiring failure in a semiconductor chip during packaging.

BACKGROUND OF THE INVENTION

Traditionally, high temperature C4 (Controlled Collapse Chip Connection) bumps have been used to bond a chip to a substrate. Conventionally, the C4 bumps are made from leaded solder, as it has superior properties. For example, lead is known to mitigate thermal coefficient (TCE) mismatch between the package and the substrate (i.e., organic laminate). Accordingly, stresses imposed during the cooling cycle were mitigated by the lead C4 bumps, thus preventing wiring layers from delaminating or other damage from occurring to the chip or the substrate.

However, lead-free requirements are now being imposed by many countries forcing manufacturers to implement new ways to produce chip to substrate joints. For example, solder interconnects consisting of tin/copper, tin/silver and SAC alloys have been used as a replacement for leaded solder interconnects. However, low ductility of such tin rich solders vs. leaded solders (Young's modulus of Sn 50 GPA vs. Pb 16 GPA) causes a transfer of stress through the C4 joint during assembly process (e.g., during a cooling cycle after reflow). Cracks in chip metallurgy under C4 bumps have been observed, which are named "white bumps" due to their appearance in sonoscan type inspection processes.

More specifically, in practice, the organic laminate has a TCE of about 18 to 20; whereas, the TCE of the chip is about 2. During the soldering process, e.g., reflow oven, the temperatures can range from about 250° C. to 260° C. This high temperature expands the organic laminate more than the chip due to the differences in the TCE. As the package (laminate, solder and chip) begins to cool, the solder begins to solidify (e.g., at about 180° C.) and the laminate begins to shrink as the chip remains substantially the same size. As the solder is robust and exceeds the strength of the chip, tensile stresses begin to delaminate structures on the chip. For example, it has been found that the wiring layers of the chip have delaminated due to the tensile stresses originating from the laminate and imposed from the solder bump to the chip. This process and resulting delamination is shown, for example, in FIG. 1.

However, currently there is no known tool to predict the location of white bumps and hence potential failure points of the chip during the packaging process. Accordingly, there exists a need in the art to overcome the deficiencies and limitations described hereinabove.

SUMMARY OF THE INVENTION

In a first aspect of the invention, a failure analysis tool comprises a computer infrastructure operable to determine a risk area for wiring layer failure during solder bump formation by determining a distance from a center of a chip to a location for a solder bump processing and identifying an area at an edge of the location for the solder bump processes at a predetermined distance and greater from the center of the chip.

In an additional aspect of the invention, a method comprises determining a distance between a center of a chip and a center of a location to be used for solder bump processing; identifying a risk area defined by a difference between a radius of the location to be used for solder bump processing (R) and a radius (r) of a guard band, both of which are measured from the center of the location to be used for solder bump processing; and locating a design sensitive structure within the risk area.

In a further aspect of the invention, a design structure is embodied in a machine readable medium for designing, manufacturing, or testing an integrated circuit. The design structure comprises determining a distance between a center of a chip and a center of a location to be used for solder bump processing; identifying a risk area defined by a difference between a radius of the location to be used for solder bump processing (R) and a radius (r) of a guard band, both of which are measured from the center of the location to be used for solder bump processing; and locating a design sensitive structure within the risk area.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention relates to a failure analysis tool and method of using the tool and a design structure for designing a mask for protecting a critical area of wiring failure in a semiconductor package. More specifically, the invention relates to a failure analysis tool configured to determine a potential location of wiring failure in a semiconductor chip during packaging, a design structure and a method of use. By implementing the invention, certain design structures, e.g., vias in the copper levels of a chip, can be identified prior to failure so that such structures can be reinforced during fabrication build. The reinforcement will be provided using a mask designed using data obtained from the failure analysis tool thereby ensuring that the wiring connections in the semiconductor structure maintain their integrity during packaging.

It has been found that the design elements most prone to failure are vias in the copper levels of the chip BEOL. Modeling data shows the stresses on the BEOL elements can be dramatically reduced by adding hard dielectric and/or soft passivation between the C4 and the BEOL metalization. The invention identifies the location of these failure points and uses such data to design a mask in order to maintain a localized area of hard dielectric to these risk areas. The design feature can be performed automatically with a design service code.

Illustrative Failure Analysis Tool

Figure 1:
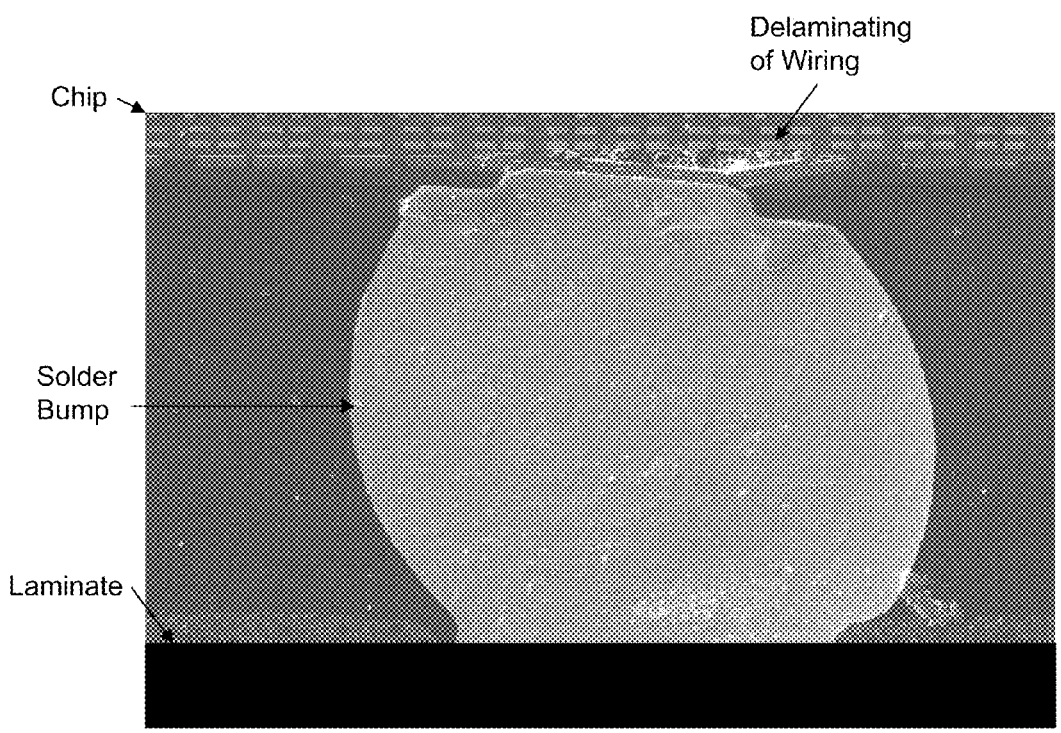
FIG. 1 shows a delaminated wiring layer on a chip after cooling of the package.
Figure 2:
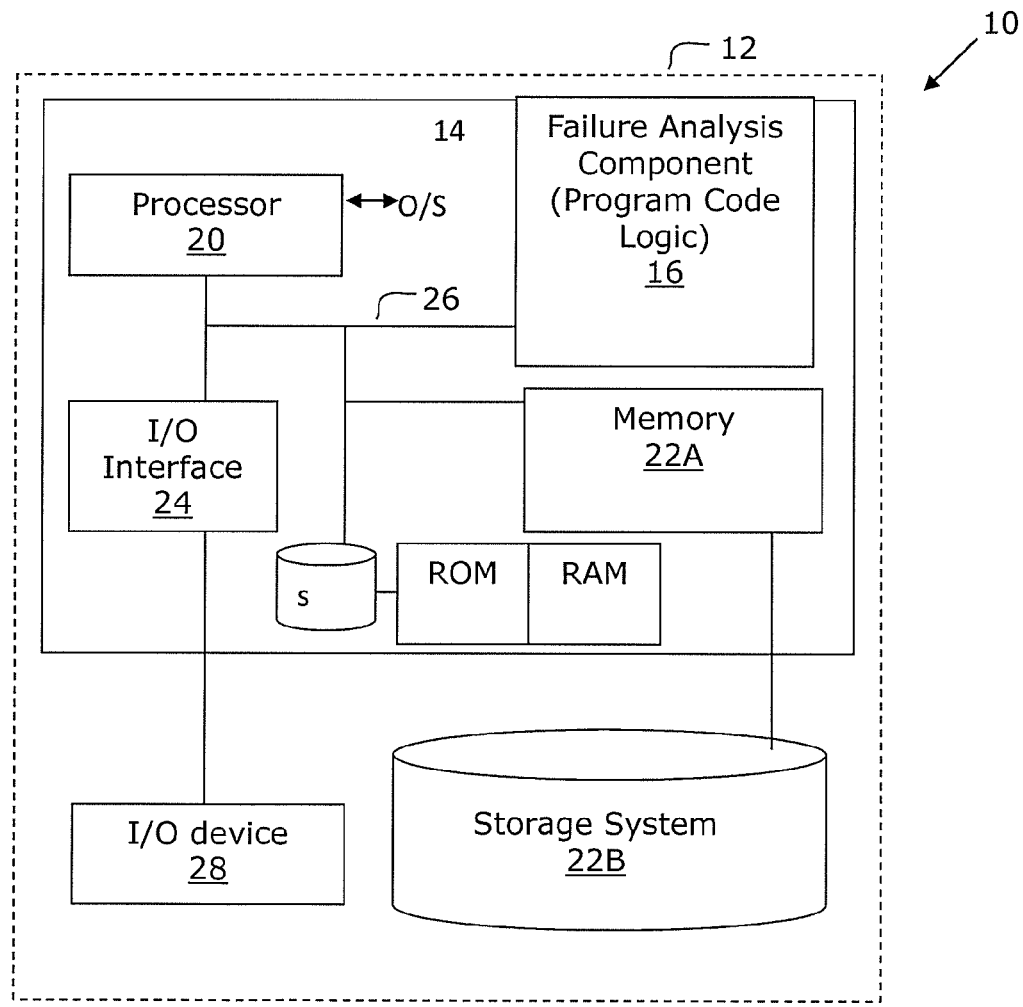
FIG. 2 shows an illustrative failure analysis tool for implementing the steps in accordance with the invention.

FIG. 2 shows an illustrative failure analysis tool 10 for managing the processes in accordance with the invention. The failure analysis tool 10 can be run on a server or a user workstation, for example. The failure analysis tool 10 includes a computer infrastructure 12 having a computing device 14. More specifically, the computing device 14 includes a failure analysis component 16 that performs several functions including, for example, determining critical areas (risk areas) for the formation of white bumps. In embodiments, the failure analysis component 16 determines a location where a solder bump will be electrically and mechanically connected to a chip (i.e., an opening in a passivation layer exposing a BEOL metallization). From this location, the failure analysis component 16 identifies via farms at an edge of the chip at a certain location relative to a line drawn between a center of the chip and the soon to be formed solder bump. The processes of the failure analysis tool 10 are described in greater detail below.

Still referring to FIG. 2, the failure analysis tool 10 includes memory 22A that can include local memory employed during actual execution of program code, bulk storage, and cache memories which provide temporary storage of at least some program code in order to reduce the number of times code must be retrieved from bulk storage during execution. The failure analysis tool 10 further includes a processor 20, an input/output (I/O) interface 24, a bus 26, Storage "S", ROM, RAM and an operating system O/S, which may be any operating system.

The processor 20 executes the computer program code and logic of the system and method of the invention, which is stored in the memory 22A. While executing the computer program code, etc., the processor 20 can read and/or write data to/from the memory 22A, storage system 22B, and/or I/O interface 24. The bus 26 provides a communications link between each of the components in the computing device 14.

In embodiments, the computer program code is accessible from a computer-usable or computer-readable medium. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM) (22), a read-only memory (ROM), a rigid magnetic disk and an optical disk.

The failure analysis tool 10 further includes an external I/O device/resource 28. The I/O device 28 can comprise any device that enables an individual to interact with the computing device 14 or any device that enables the failure analysis tool 10 to analyze a chip. For example, the external I/O device/resource 28 may be a probe, scanner, keyboard, display, pointing device, etc.

Exemplary Analyses

Figure 3:
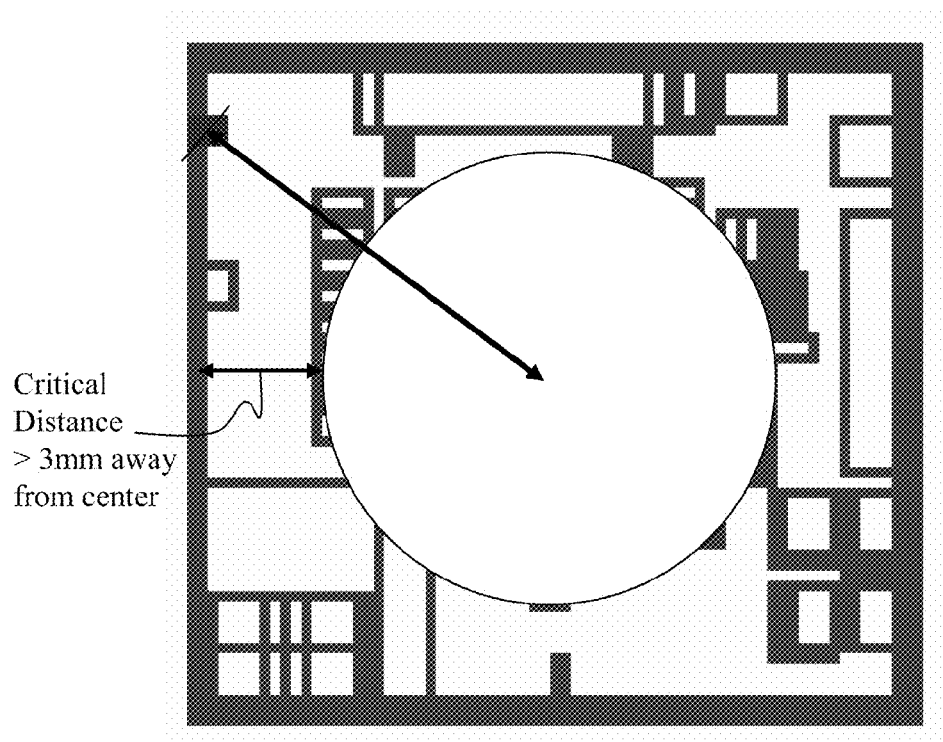
FIGS. 3, 4A and 4B show pad analyses in accordance with aspects of the invention.

FIG. 3 shows a pad analysis in accordance with aspects of the invention. More specifically, FIG. 3 shows a sensitive design structure, e.g., via farm, identified at an edge of a chip using the failure analysis tool of the invention. In more specificity, the failure analysis tool identifies a C4 process, e.g., an opening of the passivation layer, e.g., PSPI (photosensitive polyimide), for BEOL processes. The failure analysis tool also determines a center of the chip. After determining the location for C4 processes and a center of the chip, the failure analysis tool extends a line (e.g., imaginary line) from the center of the chip through the location for C4 processes (e.g., about a center of an opening of the passivation layer). In embodiments, the failure analysis tool can extend the line to an edge of the chip to determine a distance of the edge to a center of the chip. Using this line as a reference, the failure analysis tool determines the location of design sensitive structures, e.g., via farms, within a critical area as defined by certain locations relative to the line and away from a center of the chip, e.g., 3 mm or more.

Figure 4A:
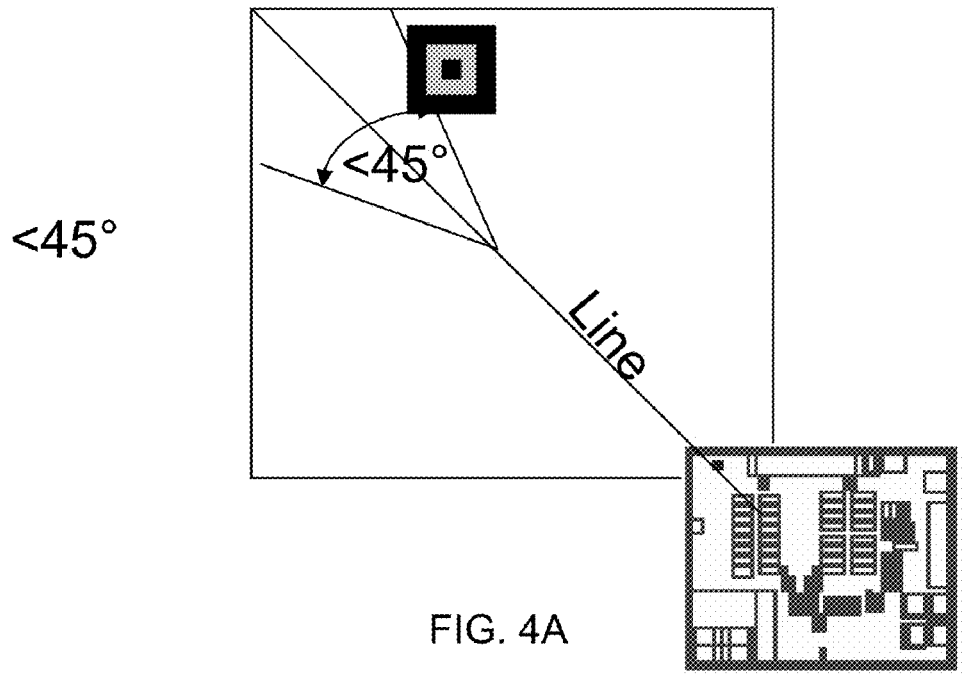
Figure 4B:
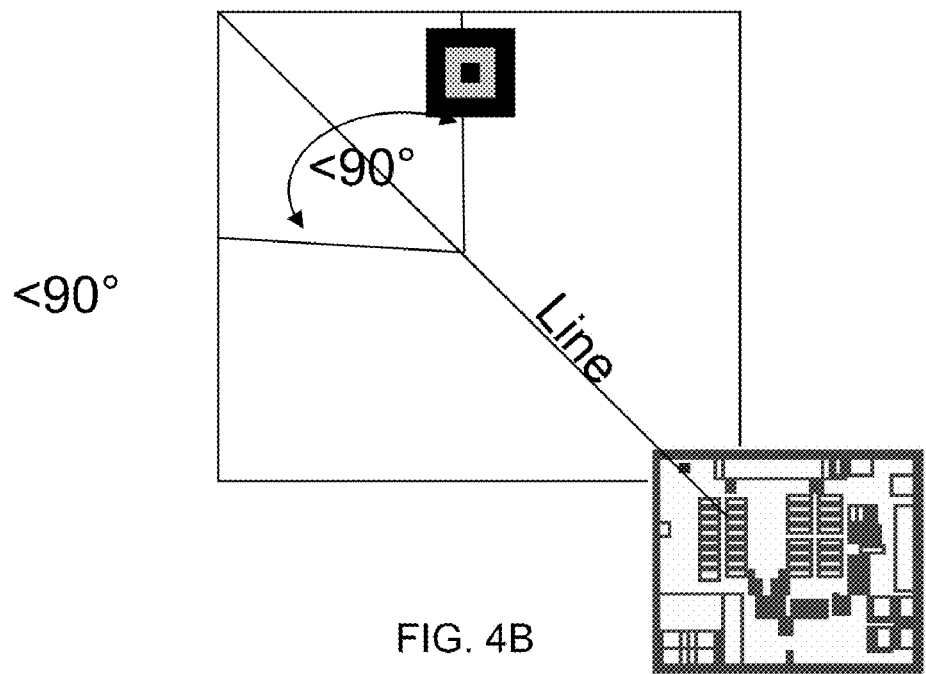

FIGS. 4A and 4B show pad analyses in accordance with aspects of the invention. More specifically, FIG. 4A shows a critical area defined by about a 45° angle or less centered on a line drawn from a center of the chip through the location of the C4 processes and more preferably at about a center of the C4 processing. FIG. 4B shows a critical area defined by about a 90° angle or less centered on a line drawn from a center of the chip through the location of the C4 processes and more preferably at about a center of the C4 processing. The critical area is further defined by a certain distance away from the center of the chip. Any via farm identified within the critical area will be flagged as a design sensitive structure and will be a candidate for reinforcement during semiconductor fabrication.

Figure 5:
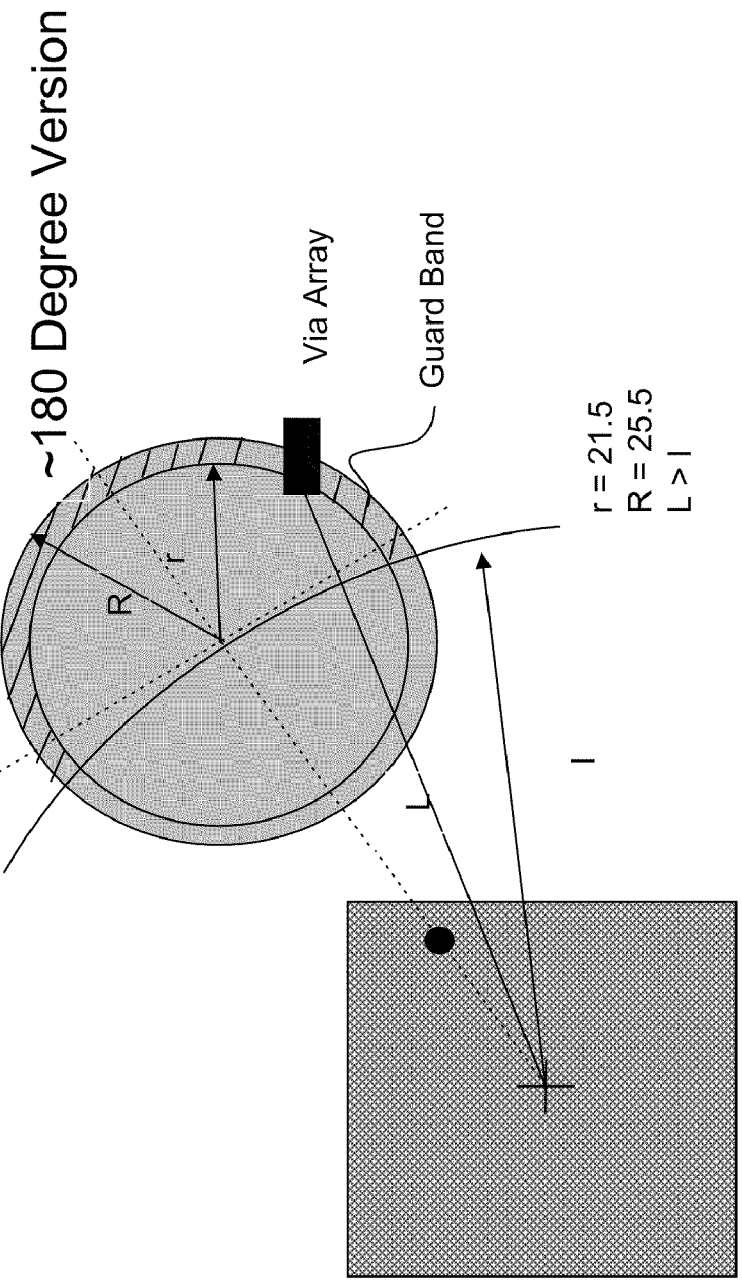
FIG. 5 shows a failure analysis approach to determine locations of "white bumps" in accordance with the invention.

FIG. 5 shows a failure analysis approach implemented by the failure analysis tool to determine locations of "white bumps" in accordance with the invention. As shown representatively in FIG. 5, the failure analysis tool identifies a center of a chip and the location of C4 processing. Knowing the center of the chip and the location of the C4 processes, the failure analysis tool determines a distance (l) between the center of the chip and a center of the C4 processes. Additionally, the failure analysis tool finds a radius (R) of the passivation opening (C4 processing), as well as a radius (r) of a guard band. The guard band is a space defined by the hash marks shown in FIG. 5. The guard band is defined by the difference between the radius (R) and the radius (r), both of which are measured from the center of the C4 processes (location to be used for solder bump processing).

A portion of the guard band is designated as a critical area (risk area) for design sensitive structures. In the embodiment of FIG. 5, the critical area of the guard band extends about 180 degrees of the circumference of the passivation opening, farthest away from the center of the chip.

In embodiments, the guard band has a radius (r) that is a percentage of the radius (R) of the passivation opening. In one example the percentage is about 85%. In alternative embodiments, an absolute value such as, for example, about 4 um, can be used to define the guard band, i.e., a value subtracted by the radius (R).

Once (R), (r) and (l) are defined, the failure analysis tool identifies via farms extending wholly or partly within the critical area of the guard band. More specifically, any via farm that is a distance (L) or greater from the center of the chip is defined as a design sensitive structure and flagged as a candidate for reinforcement and/or strengthening prior to the C4 processes. In embodiments, (L) is any value greater than (l). Once the exact location of the via farm is identified, the failure analysis tool provides such information to a masking tool.

The masking tool, in turn, creates a mask which ensures that the location of the via farm is blocked during etching of an upper hard dielectric layer positioned over the identified via farm.

Figure 6:
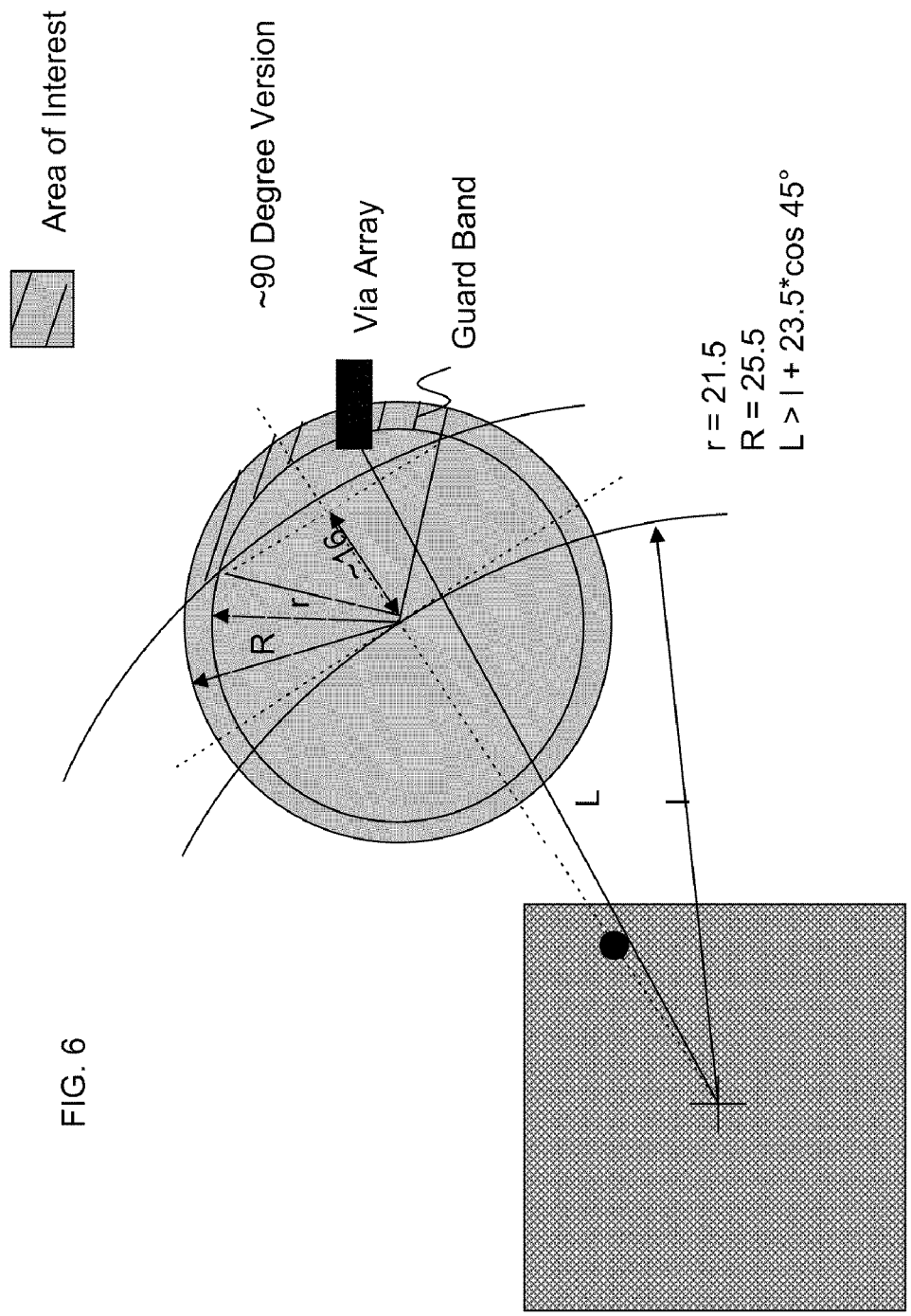
FIG. 6 shows a failure analysis approach to determine locations of "white bumps" in accordance with the invention.

FIG. 6 shows a failure analysis approach implemented by the failure analysis tool to determine locations of "white bumps" in accordance with the invention. As shown representatively in FIG. 6, the failure analysis tool identifies a center of a chip and the location of C4 processing. Knowing the center of the chip and the location of the C4 processes, the failure analysis tool identifies a distance (l) between the center of the chip and the center of the C4 processes. Additionally, the failure analysis tool finds a radius (R) of the passivation opening (C4 processing), as well as a radius (r) of a guard band. The guard band is a space defined by the hash marks shown in FIG. 6.

A portion of the guard band is designated as the critical area for finding design sensitive structures about a portion of the circumference of the passivation opening. In the embodiment of FIG. 6, the critical area guard band extends about 90 degrees of the circumference of the passivation opening, farthest away from the center of the chip. As should be understood by those of skill in the art the guard band for the first and second approach can extend at other angles such as, for example, any angle from greater than 0 degrees to about 180 degrees.

As previously discussed, in embodiments, the guard band has a radius (r) that is a percentage of the radius (R) of the passivation opening. In one example the percentage is about 85%. In alternative embodiments, an absolute value such as, for example, about 4 um, can be used to define the guard band, i.e., a value subtracted by the radius (R).

Once (R), (r) and (l) are defined, the failure analysis tool identifies via farms extending wholly or partly within the critical area of the guard band. More specifically, any via farm that is a distance (L) from the center of the chip is defined as a design sensitive structure and flagged as a candidate for reinforcement and/or strengthening prior to the C4 processes. In embodiments, (L) is greater than (l)+23.5*cos 45' (or other multiples of (l) equivalent to an adjusted location of the guard band from greater than 0 degrees to about 180 degrees about a circumference of the opening of the passivation layer). Once the exact location of the via farm is identified, the failure analysis tool provides such information to a masking tool. The masking tool, in turn, creates a mask which ensures that the location of the via farm is blocked during etching of an upper hard dielectric layer positioned over the identified via farm.

Figure 7:
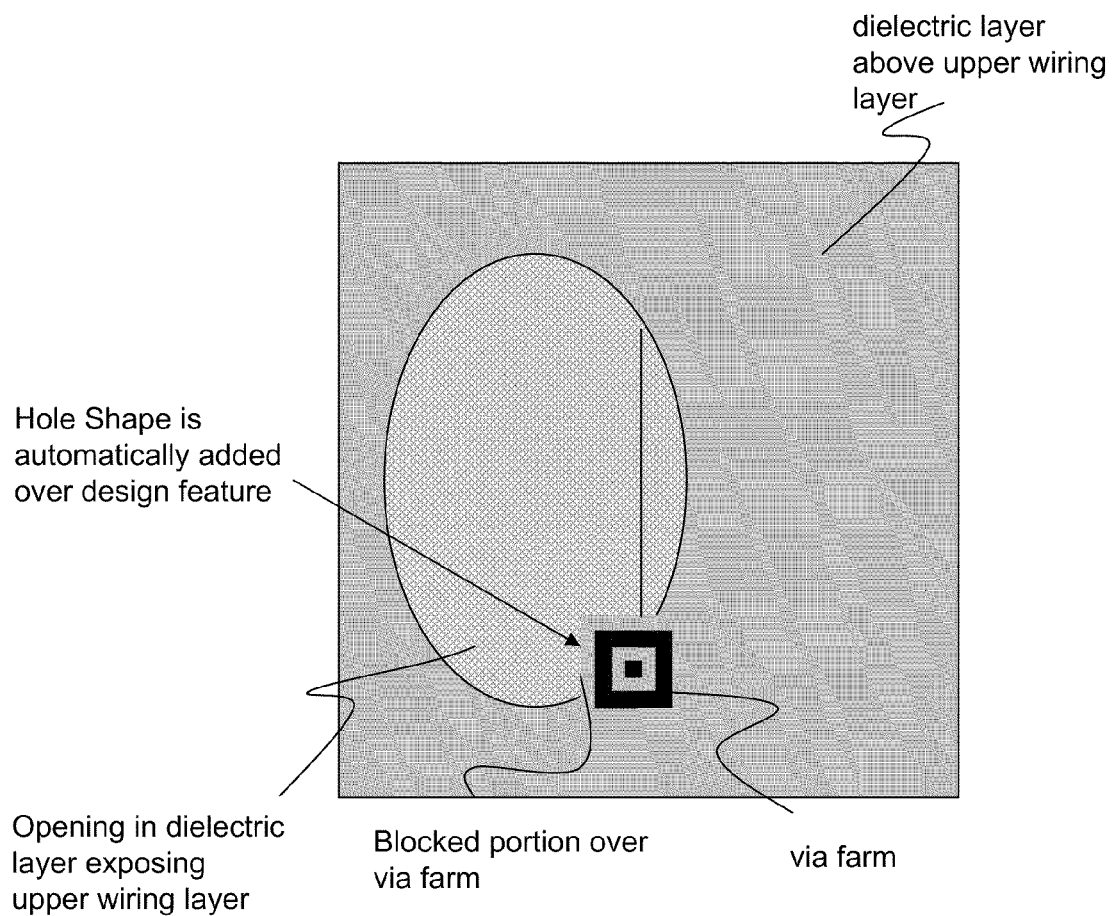
FIG. 7 shows a mask fabricated using data obtained from the failure analysis tool in accordance with the invention.

FIG. 7 shows a mask fabricated using data obtained from the failure analysis tool in accordance with the invention. As shown in FIG. 7, using the data obtained from the failure analysis tool, a mask tool creates a mask that will have features allowing an opening to be formed in a dielectric material, exposing an underlying metal layer. The mask will block the opening from forming over the identified design sensitive structure, at en edge of a passivation opening.

Design Structure

Figure 8:
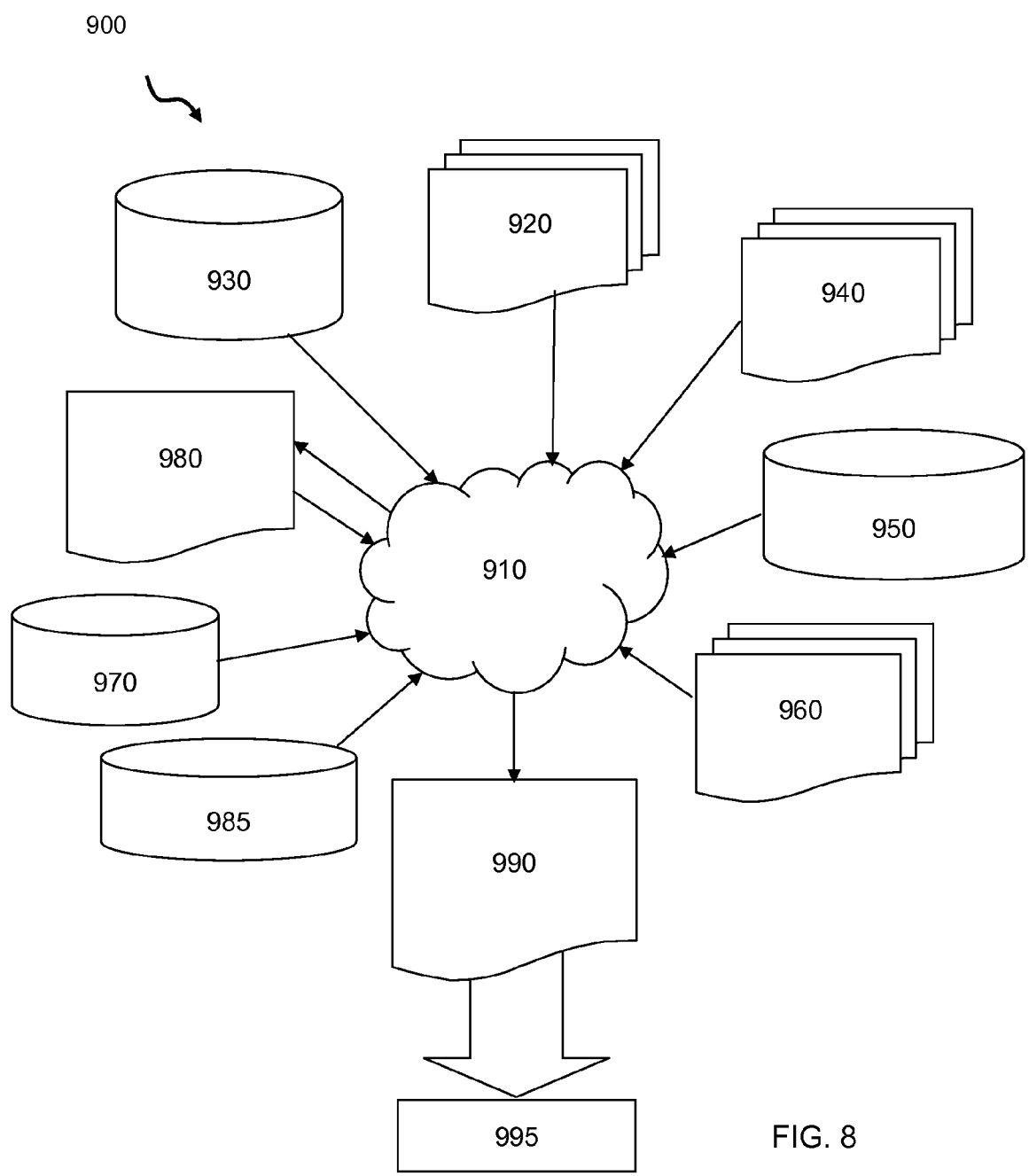
FIG. 8 is a flow diagram of a design process used in semiconductor design, manufacture, and/or test.

FIG. 8 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown by the mask of FIG. 7 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown by the mask of FIG. 7. Design process 910 preferably synthesizes (or translates) an embodiment of the invention as by the mask of FIG. 7 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown by the mask of FIG. 7, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown by the mask of FIG. 7. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of embodiments, those of skill in the art will recognize that the invention can be practiced with modifications and in the spirit and scope of the appended claims.

What is claimed is:

1. A system comprising:
a failure analysis tool having, a computer infrastructure configured to determine a risk area for wiring layer failure during solder bump formation by determining a distance from a center of a chip to a location for a solder bump processing and identifying an area at an edge of the location for the solder bump processes at a predetermined distance and greater from the center of the chip.

2. The system of claim 1, wherein the computer infrastructure is configured to determine the risk area by identifying a line from the center of the chip to a location for a solder bump processing and determining an angle about the line originating at about a center of the location for the solder bump processing.

3. The system of claim 2, wherein the angle is about 45 degrees or less.

4. The system of claim 1, wherein the angle is about 90 degrees or less.

5. The system of claim 1, wherein the computer infrastructure is configured to define a guard band in which the risk area is at least partly located therein.

6. The system of claim 5, wherein the computer infrastructure defines the guard band by defining an area within a predetermined distance away from the center of the chip and from an edge of the location for solder bump processing.

7. The system of claim 6, wherein the predetermined distance is within about 3 mm from an edge of the chip.

8. The system of claim 6, wherein the predetermined distance is about 85% of a radius measured from a center of the location for a solder bump processing.

9. The system of claim 5, wherein the risk area includes about 180 degrees about a circumference of the guard band, farthest away from the center of the chip is defined as the risk area.

10. The system of claim 5, wherein the risk area includes about 90 degrees about a circumference of the guard band, farthest away from the center of the chip is defined as the risk area.

11. The system of claim 5, wherein the computer infrastructure provides data of the risk area to a design masking tool.

12. A method, comprising:
determining a distance using a processor, the distance being between a center of a chip and a center of a location to be used for solder bump processing;
identifying a risk area using a processor, the risk area being defined by a difference between a radius of the location to be used for solder bump processing (R) and a radius (r) of a guard band, both of which are measured from the center of the location to be used for solder bump processing; and
locating a design sensitive structure using a processor, the design sensitive structure being at least partly within the risk area.

13. The method of claim 12, wherein the risk area is within a portion of the guard band.

14. The method of claim 13, wherein the portion is about 180 degrees about a circumference of the location to be used for solder bump processing, farthest from the center of the chip.

15. The method of claim 13, wherein the portion is about 90 degrees about a circumference of the location to be used for solder bump processing, farthest from the center of the chip.

16. The method of claim 13, further comprising providing the location of the design sensitive structure to a masking tool.

17. A design structure encoded on a machine-readable data storage medium, the design structure comprising steps that when processed in a computer-aided design system generates a machine-executable representation of functionality of a failure analysis tool the step comprising:
determining a distance between a center of a chip and a center of a location to be used for solder bump processing;
identifying a risk area defined by a difference between a radius of the location to be used for solder bump processing (R) and a radius (r) of a guard band, both of which are measured from the center of the location to be used for solder bump processing; and
locating a design sensitive structure within the risk area.

18. The design structure of claim 17, wherein the design structure comprises a netlist.

19. The design structure of claim 17, wherein the design structure resides on storage medium as a data format used for the exchange of layout data of integrated circuits.

* * * * *